United States Patent
Zhang et al.

(10) Patent No.: US 7,438,759 B2
(45) Date of Patent: *Oct. 21, 2008

(54) AMBIENT ENVIRONMENT NANOWIRE SENSOR

(75) Inventors: Fengyan Zhang, Vancouver, WA (US); Robert A. Barrowcliff, Vancouver, WA (US); Jong-Jan Lee, Camas, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 409 days.

This patent is subject to a terminal disclaimer.

(21) Appl. No.: 11/264,113

(22) Filed: Nov. 1, 2005

(65) Prior Publication Data

US 2008/0010707 A1   Jan. 10, 2008

Related U.S. Application Data

(63) Continuation-in-part of application No. 10/971,330, filed on Oct. 21, 2004, now Pat. No. 7,255,745.

(51) Int. Cl.
*C30B 1/02* (2006.01)

(52) U.S. Cl. .................. 117/4; 117/8; 117/9; 117/94; 117/95; 977/712; 977/762

(58) Field of Classification Search .................. 117/4, 117/8, 9, 94, 95; 977/712, 762
See application file for complete search history.

(56) References Cited

U.S. PATENT DOCUMENTS 7,098,144 B2 *   8/2006   Zhang et al. ................ 438/734

* cited by examiner

*Primary Examiner*—Robert M Kunemund
(74) *Attorney, Agent, or Firm*—Law Office of Gerald Maliszewski; Gerald Maliszewski (57) ABSTRACT

An ambient environment nanowire sensor and corresponding fabrication method have been provided. The method includes: forming a substrate such as Silicon (Si) or glass; growing nanowires; depositing an insulator layer overlying the nanowires; etching to expose tips of the nanowires; forming a patterned metal electrode, with edges, overlying the tips of the nanowires; and, etching to expose the nanowires underlying the electrode edges. The nanowires can be a material such as $IrO_2$, $TiO_2$, $InO$, $ZnO$, $SnO_2$, $Sb_2O_3$, or $In_2O_3$, to mane just a few examples. The insulator layer can be a spin-on glass (SOG) or low-k dielectric. In one aspect, the resultant structure includes exposed nanowires grown from the doped substrate regions and an insulator core with embedded nanowires. In a different aspect, the method forms a growth promotion layer overlying the substrate. The resultant structure includes exposed nanowires grown from the selectively formed growth promotion layer.

24 Claims, 6 Drawing Sheets

☒ SUBSTRATE ◻ SiO₂
◻ TOP ELECTRODE ＼ NANO WIRES

☒ HEAVILY DOPED REGION
◻ UNDOPED REGION

Fig. 11

☒ SUBSTRATE ◻ UNDOPED REGION ＼ NANOWIRES

☒ HEAVILY DOPED SUBSTRATE
▨ THIN Ti LAYER  \ NANOWIRES

Fig. 18

☒ HEAVILY DOPED SUBSTRATE
▨ THIN Ti LAYER  \ NANOWIRES  ▨ SPIN ON HSQ

Fig. 19

☐ TOP ELECTRODE        ☒ HEAVILY DOPED SUBSTRATE
▨ THIN Ti LAYER  \ NANOWIRES  ▨ SPIN ON HSQ

Fig. 20

☐ TOP ELECTRODE        ☒ HEAVILY DOPED SUBSTRATE
▨ THIN Ti LAYER  \ NANOWIRES  ▨ SPIN ON HSQ

Fig. 21

AMBIENT ENVIRONMENT NANOWIRE SENSOR

RELATED APPLICATIONS

This application is a Continuation-In-Part, claiming priority under 35 U.S.C. 120 to a pending patent application entitled, IRIDIUM OXIDE NANOWIRES AND METHOD FOR FORMING SAME, invented by Zhang et al., Ser. No. 10/971,330, filed Oct. 21, 2004 now U.S. Pat. No. 7,255,745, which is incorporated herein by reference.

BACKGROUND OF THE INVENTION

1. Field of the Invention

This invention generally relates to integrated circuit (IC) fabrication and, more particularly, to an ambient environment nanowire sensor and a method for fabricating the same.

2. Description of the Related Art

Recently, the fabrication of nanowires has been explored, due to its potential importance as a building block in nano, microelectromechanical (MEM), and nanoelectromechanical NEM device applications. For example, researchers associated with Charles Lieber have reported the synthesis of a variety of semiconductor nanowires made from materials such as silicon (Si), Si-germanium (SiGe), InP, and GaN, for use in building nano-computing system. Other groups have also reported using templates structures to grow metallic nanowires made of materials such as Ni, NiSi, Au, and Pt. Metallic nanowires can be used as interconnections and the sharp tips of the nanowire make them effective for field emission purpose. ZnO nanowires are potentially useful as a light emission element.

However, few processes have been reported that are able to form metallic nanowires without the use of porous material forms or templates. The templates add a considerable degree of complexity to the process. Thus, a more practical and commercially feasible means of forming metallic nanowires publications is desirable. It would be especially useful if iridium oxide ($IrO_2$) nanowire could be grown using a metalorganic chemical vapor deposition (MOCVD) methods without a template. $IrO_2$ is a conductive metal oxide that is already widely used in DRAM and FeRAM applications. $IrO_2$ can be used as a conductive electrode, as it has stable electrical and chemical properties, even at high temperature $O_2$ ambient conditions. $IrO_2$ can also be used as pH sensor material. Ir thin film can be deposited using PVD easily with excellent polycrystalline structure and strong (111) orientation. $IrO_2$ can be formed afterwards, by oxidizing the Ir film, or it can be formed directly using reactive sputtering method at higher temperatures in oxygen ambient. CVD methods have recently been developed to grow Ir and $IrO_2$ thin films. It is relatively easy to maintain good composition control in CVD processes, and the method is know to provide good step coverage.

Reui-San Chen et al. have published a paper that discusses making $IrO_2$ nanorods using MOCVD and (methylcyclopentadienyl) (1,5-cyclooctadiene) iridium (I) as precursor. They have also explored the potential of using $IrO_2$ nanorods for field emission applications. The nanorods they grew were a few microns long and around 100 nanometers (nm) in diameter. However, successfully repeated experiments obtaining similar vertically aligned $IrO_2$ nanorods show that, although these structures exhibit sharp tips, the crystal structure is amorphous or polycrystalline. The crystalline structure is a result of defects, or a high dislocation density, resulting from the fact that there is insufficient diffusion to overcome the effects of shadowing during growth, which acts to provide more precursor to the nanorod tips than to the nanorod stem, or rod bottom sections.

SUMMARY OF THE INVENTION

The $IrO_2$ nanowires have been successfully grown on a Si substrate with a thin layer of Ti. Nanowires can also be formed on a heavily doped Silicon-on-Insulator (SOI) wafer surface, with a thin layer of metal particles such as Ti. After patterning the Ti layer, the selective growth of the $IrO_2$ nanowires can be realized. Ta, Au, Ni, Co, and similar materials can also act as the growth promotion layer. The present invention applies these techniques to the fabrication of a nanowire device suitable for sensing gas and liquid environments.

Accordingly, a method is provided for forming an ambient environment nanowire sensor. The method comprises: forming a substrate such as Silicon (Si), SOI, or glass; growing nanowires; depositing an insulator layer overlying the nanowires; etching to expose tips of the nanowires; forming a patterned metal electrode, with edges, overlying the tips of the nanowires; and, etching to expose the nanowires underlying the electrode edges. The nanowires can be a material such as $IrO_2$, $TiO_2$, InO, ZnO, $SnO_2$, $Sb_2O_3$, or $In_2O_3$, to name just a few examples. The insulator layer can be a spin-on glass (SOG) or low-k dielectric.

In one aspect, the substrate includes a doped portion underlying the electrode edges, and an undoped portion between the overlying electrode edges. Then, etching to expose the nanowires underlying the electrode edges includes etching to expose the doped substrate portions. The resultant structure includes exposed nanowires grown from the doped substrate regions and an insulator core with embedded nanowires.

In a different aspect, the method forms a growth promotion layer overlying the substrate. For example, the method selectively forms the growth promotion layer on portions of the substrate underlying the electrode edges. The resultant structure includes exposed nanowires grown from the selectively formed growth promotion layer and an insulator core interposed between the substrate and the top electrode.

Additional details of the above-described method and an ambient environment nanowire sensor are described below.

DETAILED DESCRIPTION

Figure 1A:
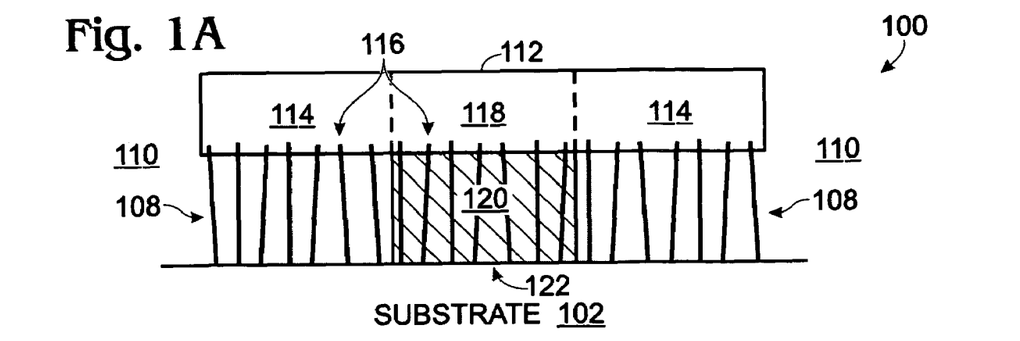
FIGS. 1A and 1B are partial cross-sectional views of ambient environment nanowire sensors.
Figure 1B:
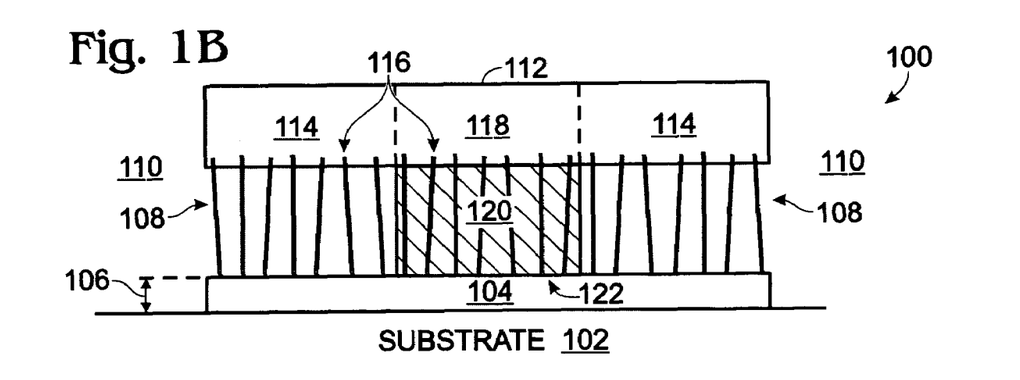

FIGS. 1A and 1B are partial cross-sectional views of ambient environment nanowire sensors. In FIG. 1A, the sensor 100 comprises a substrate 102. The substrate 102 can be a material such as Silicon-on-Insulator (SOI), Si, polycrystalline Si, SiGermanium (SiGe), glass, plastic, quartz, or a transparent conductive electrode. One example of a transparent conductive electrode is Indium Tin oxide (ITO). Other transparent conductive electrode materials are known in the art. In one aspect, the substrate 102 is doped with a p-type and n-type dopant. The type of substrate that is typically doped, is one that contains Si.

A first plurality of nanowires 108 are grown from the substrate 102 and exposed to an ambient environment 110. That is, nanowires 108 are grown nanowires. It should be noted that "grown" nanowires can be distinguished from nanostructures that are grown on one substrate, "harvested", and then dispersed onto a different substrate. For example, harvested nanowires can be spun-on in a solvent, and the solvent evaporated. This method of forming nanowires is often referred to as the "pick and place" method. The nanowires 108 can be a material such as $IrO_2$, $TiO_2$, InO, ZnO, $SnO_2$, $Sb_2O_3$, $In_2O_3$, carbon, Pd, Pt, Au, Mo, Si, Ge, SiGe, CdSe, AlN, ZnS, InP, or InAs.

In one aspect (not shown), the nanowire may include a core and shell structure made from a combination of two of the above-mentioned materials. In a different aspect (not shown), the nanowire may have a segmented axis structure where each segment is made from one of the above-mentioned materials. Although the nanowires are depicted as having a circular cross-section, in other aspects the nanowires may have a square, triangular, or oval shape. Further, is some aspects not shown, there may be a cavity or hollow region in the center of the core. Alternately, a nanowire may be referred to as a nanorod, nanostructures, or nanotube.

A patterned metal electrode 112 with edge regions 114 overlies the tips 116 of the first plurality of nanowires 108. The electrode 112 also has a center region 118 between the edge regions 114. An insulator layer 120 is interposed between the substrate 102 and the electrode center region 118. The insulator layer 120 can be a spin-on glass (SOG), such as silicates, phosphosilicates, or siloxanes. Alternately, the insulator layer 120 may be a low-k spin-on dielectrics such as nanoglass, MSQ (CH3SiO1.5), methyl silsequioxane, HSQ hydrogen silsequioxane (methyl Isobutyl Ketone), or silk. In another aspect, the insulator layer 120 is a stiochiometric composition Silicon oxide.

As shown in FIG. 1A, the insulator layer directly overlies a portion of the substrate 102, under the electrode center region 118. In the sensor 100 of FIG. 1A, a second plurality of nanowires 122 are grown from the substrate underling the electrode center region 118. That is, nanowires 122 are grown nanowires. The insulator layer 120 overlies the second plurality of nanowires 122, and the electrode center region 118 overlies the tips 124 of the second plurality of nanowires 122.

The sensor 100 of FIG. 1B is similar to the one shown in FIG. 1A, except that a growth promotion layer 104 overlies the substrate 102. The growth promotion layer 104 is a material such as Ti, Ni, Au, Ta, Co, Ir, or Pt. Typically, the growth promotion layer 104 has a thickness 106 in the range of about 0.5 to 5 nanometers (nm). As shown, the nanowires 108 and 122 are grown from, and directly overlie the growth promotion layer 104.

Figure 2:
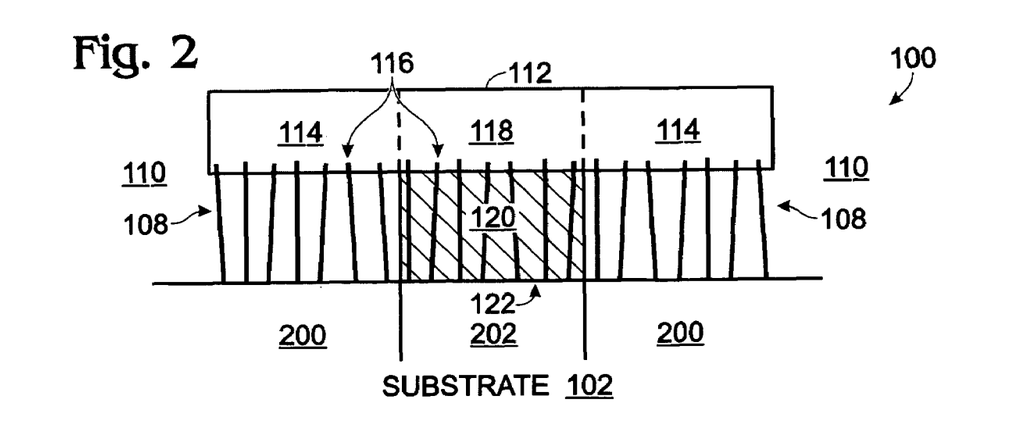
FIG. 2 is a partial cross-sectional view of a variation of the sensor of FIG. 1A.

FIG. 2 is a partial cross-sectional view of a variation of the sensor of FIG. 1A. In this aspect, the substrate 102 includes doped portions 200 and an undoped substrate portion 202. For example, the substrate may be Si, and the doped portions 200 may include a p-type dopant. The first plurality of nanowires 108 overlie the doped substrate portions 200 and the second plurality of nanowires 122 overlie the undoped substrate portion 202. Alternately stated, the doped substrate portions 200 are exposed to the ambient environment, while the undoped substrate portion 202 is covered by the insulator layer 120. Although not specifically shown, in some aspects the nanowires 108 and 122 may be grown from a growth promotion layer, as in FIG. 1B.

Figure 3:
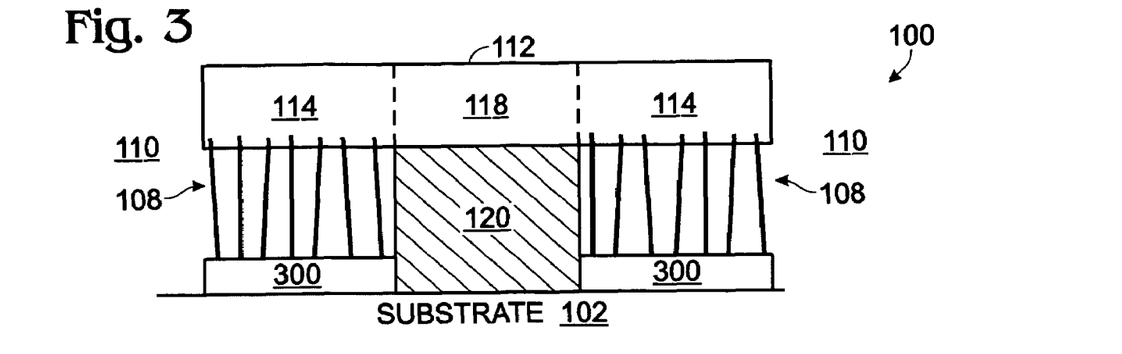
FIG. 3 is a partial cross-sectional view of a variation of the sensor of FIG. 1B.

FIG. 3 is a partial cross-sectional view of a variation of the sensor of FIG. 1B. The growth promotion layer is selectively formed in portions 300 that underlie the electrode edge regions 114. No growth promotion layer underlies the electrode center region 118, and nanowires 108 are not formed on the substrate under the electrode center region 118. Alternately stated, the second plurality of nanowires seen in FIGS. 1A, 1B, and 2 are not formed in FIG. 3. The insulator layer 120 does not include any embedded nanowires. In other aspect not shown, the insulator layer may partly overlie the growth promotion portions 300, in which case some nanowires may be embedded in the insulator.

FUNCTIONAL DESCRIPTION

Figure 4:
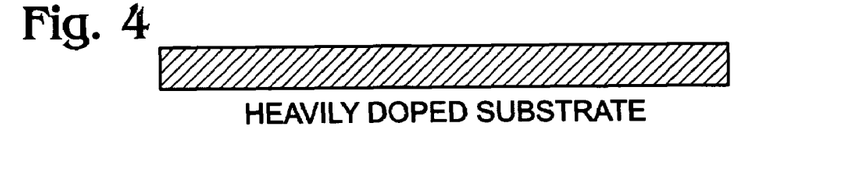
FIGS. 4 through 8 depict steps in the fabrication of an ambient environment nanowire sensor.

FIGS. 4 through 8 depict steps in the fabrication of an ambient environment nanowire sensor. In FIG. 4, an SOI wafer is used as the substrate. Other materials such as Si, Poly-Si, or SiGe can also be used as the substrate. The substrate is doped with another element to form either a p or n-type substrate. An activation annealing is performed to active the dopants. Optionally but not shown, a thin layer of metal, such as Ti, can be deposited on the Si surface with the thickness in the range of about 0.5-5 nm. Ni, Au, Ta, Co, Ir, or Pt can also be used as the nanowire growth promotion layer, with the thickness in the range of 0.5-5 nm. Annealing in $O_2$, $N_2$, Ar, vacuum, or forming gas at 300-1000° C. activates the promotion layer and enhances the nanowires growth.

Figure 5:
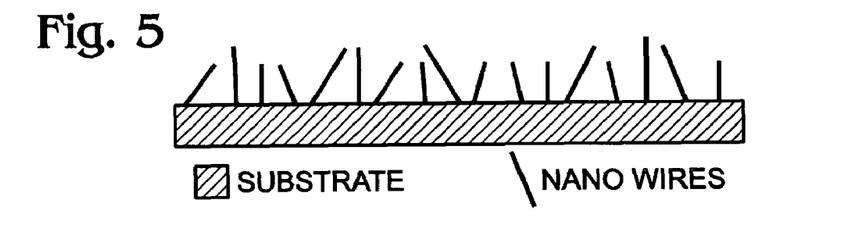

In FIG. 5, the wafer is transferred to the growth chamber for $IrO_2$ nanowires growth. (Methylcyclopentadienyl)(1,5-cyclooctadiene)iridium(I) is used as precursor. Both the precursor and the transport line are maintained at a constant temperature of about 60-100° C. High purity oxygen at a flow rate of 50-500 sccm is used as the reaction gas. Ar gas, at flow rate of 50-500 sccm, is used as the carrier gas through the Ir precursor ampule. The base pressure for MOCVD is in the range of about $1 \times 10^{-8}$ to $1 \times 10^{-3}$ torr. Then, a higher chamber pressure of about 1-500 torr, and preferably in the range of about 10-100 torr, is maintained using the $O_2$ bypass line, before the introduction of the precursor into the growth chamber. The growth temperature in the chamber is in the range of about 200-500° C., and is preferably in the range of about 300-400° C. The pressure of the chamber is held at 1-500 torr, and preferably in the range of about 10-100 torr during growth.

Figure 6:
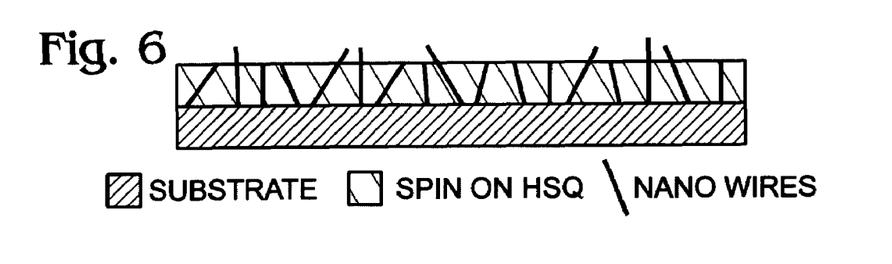

FIG. 6 shows the deposition of the insulator layer, after the nanowires growth. A spin on glass (SOG), such as a silicate, phosphosilicate, or siloxane may be used. A low-k spin-on dielectric, such as nanoglass, MSQ (CH3SiO1.5), methyl silsesquioxane, HSQ hydrogen silsesquioxane (methyl Isobutyl Ketone), or silk can also be spun on to coat the $IrO_2$ nanowires, cover the $IrO_2$ nanowires, and to form a flat surface. Multiple layers of the SOG can be applied, if needed, to cover the nanowires. If the HSQ solution is used, the spin speed is about 100-10000 RPM. A baking is performed after each spin on layer, in the temperature range of about 100-400° C.

Figure 9:
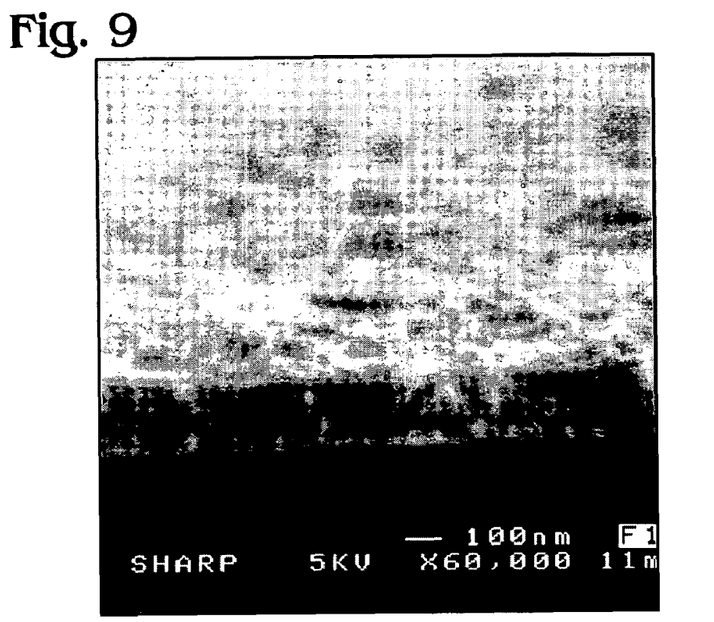
FIG. 9 is a scanning electron microscope (SEM) picture of a HSQ insulator layer formed over $IrO_2$ nanowires.
Figure 10:
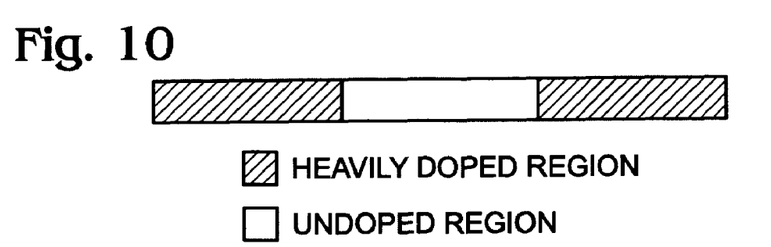
FIGS. 10 through 14 depict steps in a first variation of the ambient environment nanowire sensor fabrication process.
Figure 11:
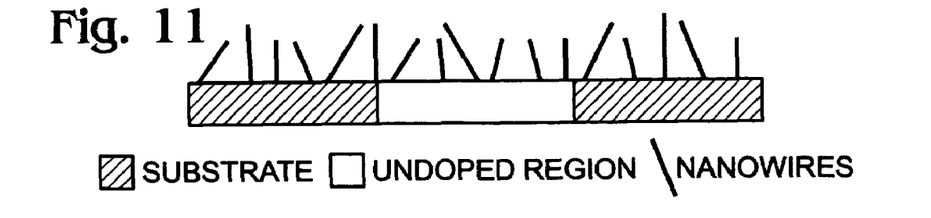

FIG. 9 is a scanning electron microscope (SEM) picture of a HSQ insulator layer formed over IrO2 nanowires.

Returning to FIG. 6, after finishing the HSQ deposition, a further annealing of the structure, in the temperature range of about 400-1000° C., can be performed to obtain a stoichiometric $SiO_2$ film. Then, a brief dip in the HF solution is performed, to just expose the tips of the nanowires.

Figure 7:
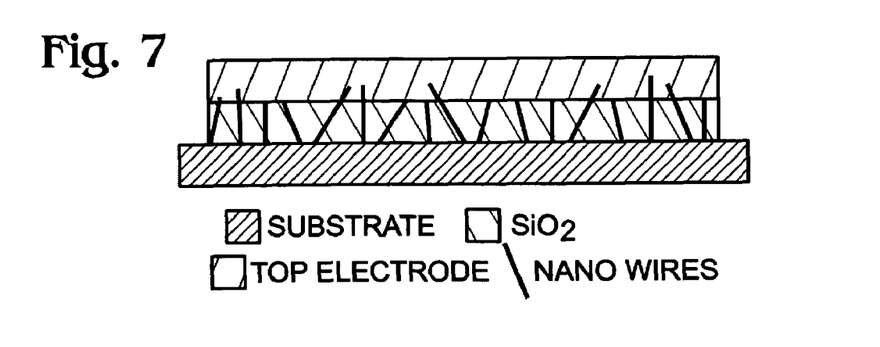

FIG. 7 depicts the formation of a top metal layer (electrode), after exposing the tips of the nanowires. The top metal layer can be a material such as Al, TiN, Pt, Ir, Au, etc., and can be deposited on top of the $SiO_2$ surface with the exposed $IrO_2$ nanowires tips. Photoresist is deposited on top of the metal layers, and patterned. Then, a dry etching process is performed on the top metal layer. The $SiO_2$ layer and nanowires under the etched metal are also removed. The photoresist is either left or striped away, depending on the etching process being used.

Figure 8:
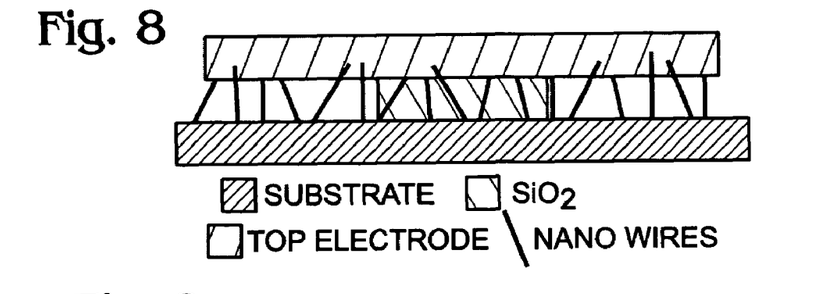

FIG. 8 depicts the competed sensor structure. After the stack etching of the top metal/$SiO_2$/nanowries, a dip of the structure in an HF solution is performed to expose the outer rim of nanowires, but leaving the middle core of the $SiO_2$, so that it may support the top electrode. The etching time depends on the size of the device. $SiO_2$ is left to support the top electrode, while enough nanowires are exposed to sense an ambient gas or solution.

A brief annealing of the structure may be performed either before, or after the last HF dip to strengthening the nanowires connection with the top electrode and bottom substrate. The annealing can be performed either in $N_2$, Ar, Forming gas, vacuum, or $O_2$, with a temperature in the range of about 200-1000° C., for about 10-3600 sec.

Figure 12:
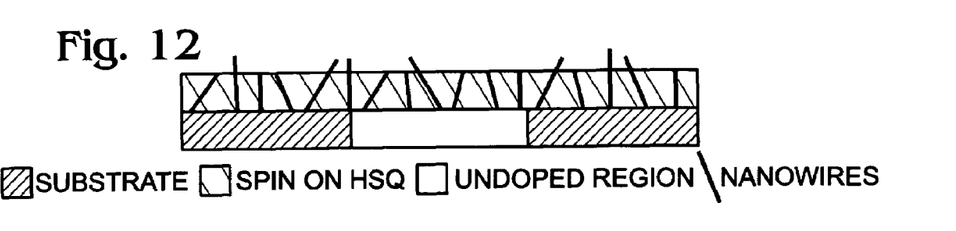
Figure 13:
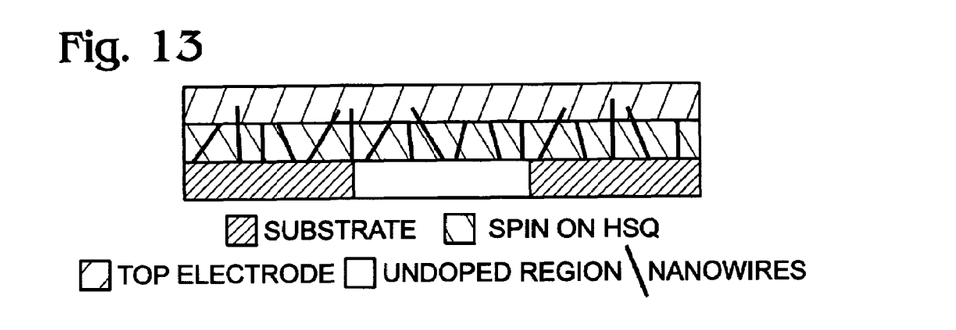
Figure 14:
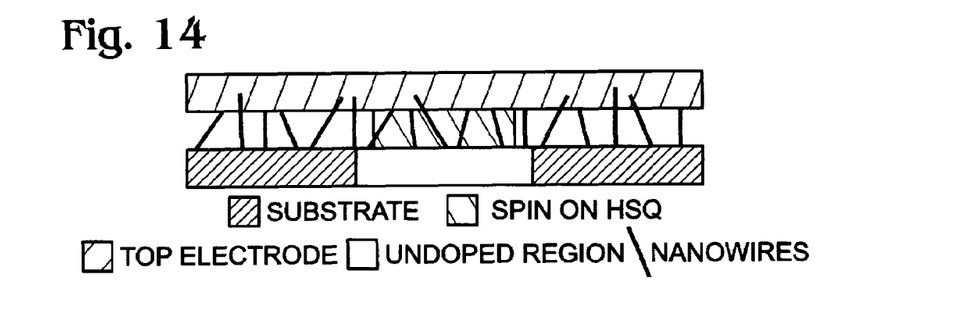
Figure 15:
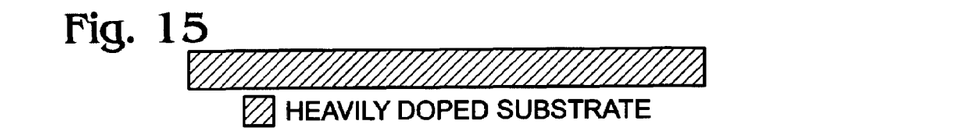
FIGS. 15 through 20 depict steps in a second variation of the ambient environment nanowire sensor fabrication process.
Figure 16:
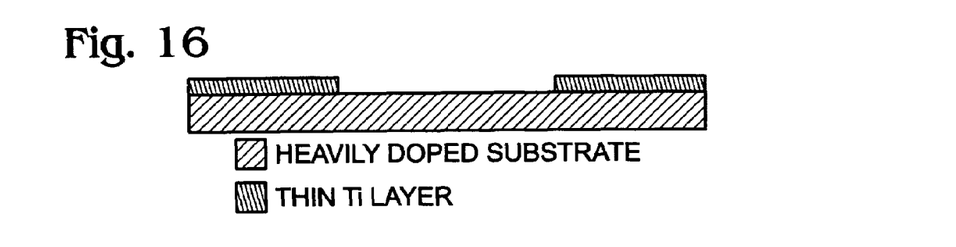
Figure 17:
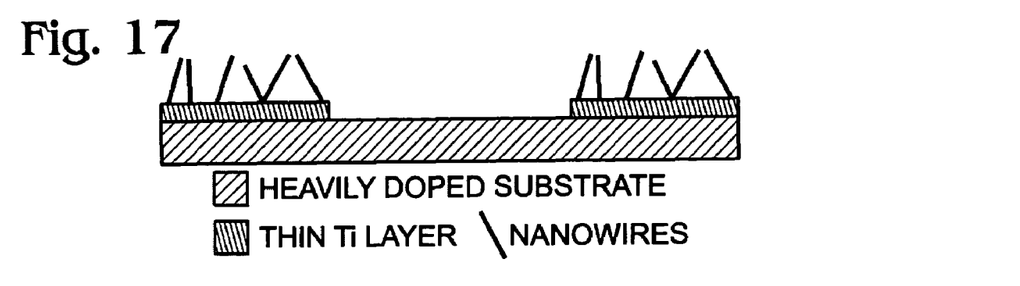
Figure 18:
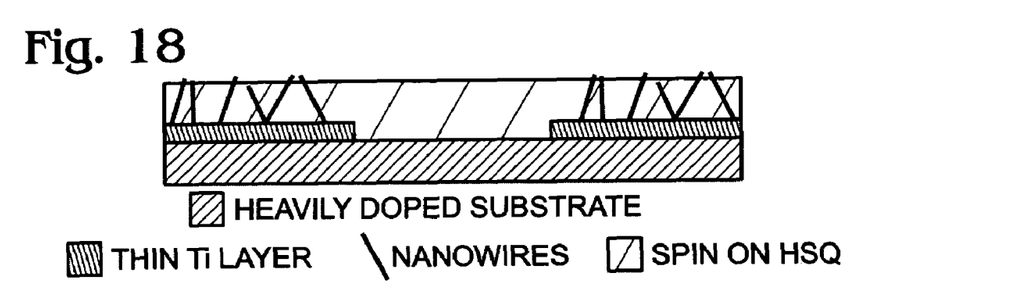
Figure 19:
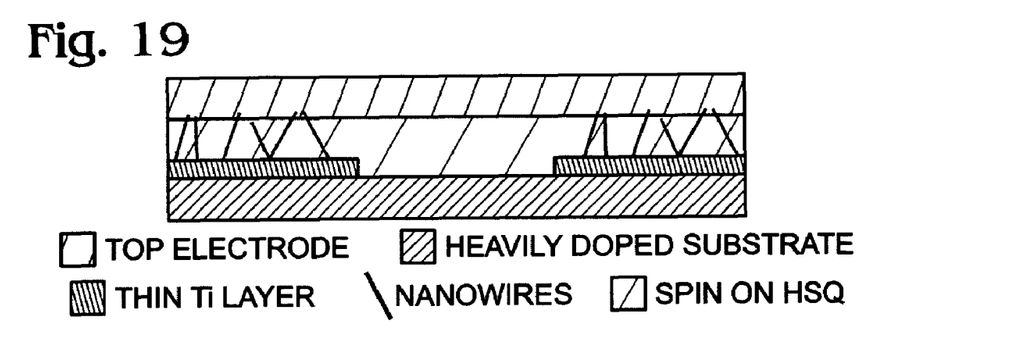

FIGS. 10 through 14 depict steps in a first variation of the ambient environment nanowire sensor fabrication process. The alternative process "disables" the interior nanowires by selective doping of the substrate (see FIG. 10). Since the undoped area of the substrate is not conductive, the nanowires grown from the undoped substrate do not contribute to any changes in sensor resistivity. Instead, sensor resistivity changes occur as a result of the exposed nanowires, grown from the doped substrate regions, being exposed to different environments. After the selective doping, the processes depicted in FIGS. 12-14 are similar to the ones described in the explanation of FIGS. 5-8, above.

FIGS. 15 through 20 depict steps in a second variation of the ambient environment nanowire sensor fabrication process. Another alternative is to pattern a Ti layer before the $IrO_2$ nanowires growth, in order to achieve the selective growth of the nanowires. The patterned growth promotion layer (Ti) can be seen in FIG. 16. The supporting $SiO_2$ region includes no nanowires, see FIG. 20. Although $IrO_2$ nanowires have been specifically mentioned, the nanowires may alternately be metal oxide materials, such as $TiO_2$, InO, ZnO, SnO2, Sb2O3, In2O3, or carbon nanotubes. Further, the nanowires may also be a metal, such as Pd, Pt Au, or Mo. In addition, the nanowires may be a semiconductor such as Si, Ge, SiGe, CdSe, AlN, ZnS, GaN, InP, InAs, or the like.

Figure 21:
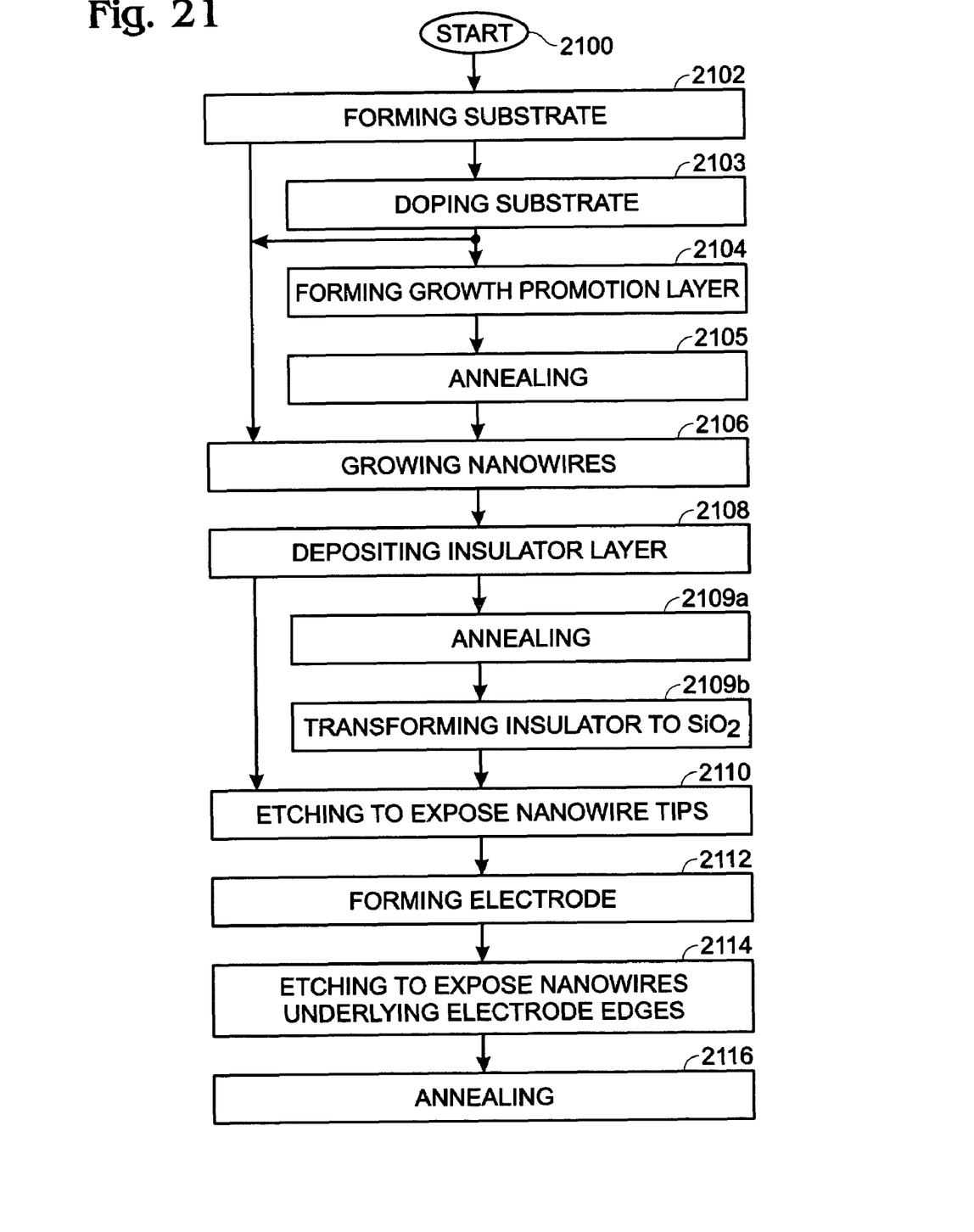
FIG. 21 is a flowchart illustrating a method for forming an ambient environment nanowire sensor.

FIG. 21 is a flowchart illustrating a method for forming an ambient environment nanowire sensor. Although the method is depicted as a sequence of numbered steps for clarity, no order need necessarily be inferred from the numbering. It should be understood that some of these steps may be skipped, performed in parallel, or performed without the requirement of maintaining a strict order of sequence. The method starts at Step 2100.

Step 2102 forms a substrate. The substrate can be a material such as SOI, Si, polySi, SiGe, glass, plastic, quartz, or a transparent conductive electrode. In one aspect, Step 2103 dopes the substrate with a p-type or n-type dopant. Step 2106 grows nanowires. Step 2108 deposits an insulator layer overlying the nanowires. Step 2110 etches to expose tips of the nanowires. Step 2112 forms a patterned metal electrode, with edges, overlying the tips of the nanowires. Step 2114 etches to expose the nanowires underlying the electrode edges. In one aspect, Step 2116 anneals at a temperature in the range of about 200 to 1000° C., for a duration in the range of about 10 to 3600 seconds, following Step 2114. Alternately, Step 2116 may be performed before Step 2114.

In one aspect, Step 2104 forms a growth promotion layer overlying the substrate from a material such as Ti, Ni, Au, Ta, Co, Ir, or Pt. Then, Step 2106 grows nanowires from the growth promotion layer. The growth promotion layer may be formed to a thickness in the range of about 0.5 to 5 nm. In another aspect, Step 2105, following the formation of the growth promotion layer, anneals in an atmosphere such as $O_2$, $N_2$, Ar, a vacuum, or a forming gas, at a temperature in the range of about 300 to 1000° C.

Growing nanowires in Step 2106 includes growing nanowires from a material such as $IrO_2$, $TiO_2$, InO, ZnO, $SnO_2$, $Sb_2O_3$, $In_2O_3$, carbon, Pd, Pt, Au, Mo, Si, Ge, SiGe, CdSe, AlN, ZnS, InP, or InAs. In some aspect, the nanowires may have a core and shell structure made from a combination of two of the above-mentioned materials. That is, the core is one material and the shell is a different material. In another aspect, the nanowires have a segmented axis structure where each segment is made from one of the above-mentioned materials.

As noted above in the description of FIG. 6, Step 2106 may grow $IrO_2$ nanowires using a metalorganic chemical vapor deposition (MOCVD) process as follows:

introducing a (Methylcyclopentadienyl)(1,5-cyclooctadiene)Iridium(I) precursor at a temperature in the range of about 60 to 100° C.;

introducing high purity oxygen at a flow rate in the range of about 50 to 500 standard cubic centimeters (sccm);

introducing Ar at a flow rate in the range of about 50 to 500 sccm, as a carrier gas for the Ir precursor;

establishing a base pressure in the range of about $1\times10^{-8}$ to $1\times10^{-3}$ torr, and using an $O_2$ bypass line, creating a subsequent pressure in the range of about 1 to 500 torr before the introduction of the Ir precursor; and, maintaining a substrate temperature in the range of about 200 to 500° C.

In one aspect, depositing the insulator layer overlying the nanowires in Step 2108 includes depositing a SOG, such as silicates, phosphosilicates, and siloxanes, or a low-k spin-on dielectric such as nanoglass, MSQ (CH3SiO1.5), methyl silsequioxane, HSQ hydrogen silsequioxane (methyl Isobutyl Ketone), or silk.

For example, if HSQ is deposited in Step 2108, the process may deposit a plurality of HSQ layers, using a spin rate in the range of about 100 to 10,000 RPM; and, after each HSQ layer deposition, bake at a temperature in the range of about 100 to 400° C.

In another aspect, Step 2109a anneals at a temperature in the range of about 400 to 1000° C., following the deposition of the insulator layer in Step 2108. Then, Step 2109b, in response to the annealing, transforms the insulator layer into a stiochiometric composition Si oxide layer.

In one aspect, doping the substrate in Step 2103 includes forming a doped portion of substrate underlying the electrode edges, and an undoped portion of the substrate between the overlying electrode edges. Then, etching to expose the nanowires underlying the electrode edges (Step 2114) includes etching to expose the doped substrate portions, see FIGS. 2 and 14.

Figure 20:
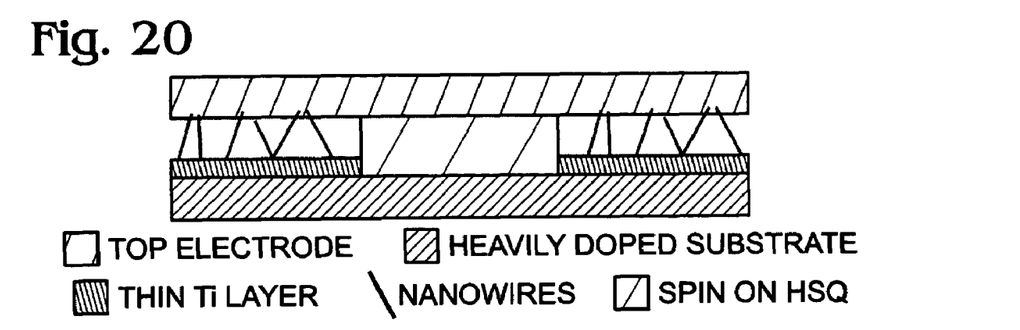

In another aspect, forming the growth promotion layer overlying the substrate in Step 2104 includes selectively forming the growth promotion layer on portions of the substrate underlying the electrode edges, see FIGS. 3 and 20.

An ambient environment nanowire sensor and fabrication method have been provided. A few examples of process specifics and materials have used to illustrate the invention. However, the invention is not limited to just these examples. Other variations and embodiments of the invention will occur to those skilled in the art.

We claim:

1. A method for forming an ambient environment nanowire sensor, the method comprising:
    forming a substrate;
    growing nanowires;
    depositing an insulator layer overlying the nanowires;
    etching to expose tips of the nanowires;
    forming a patterned metal electrode, with edges, overlying the tips of the nanowires; and,
    etching to expose the nanowires underlying the electrode edges.

2. The method of claim 1 wherein forming the substrate includes forming a substrate from a material selected from the group consisting of Silicon-on-insulator (SOI), Silicon (Si), polycrystalline Si, SiGermanium (SiGe), glass, plastic, quartz, and a transparent conductive electrode.

3. The method of claim 1 further comprising:
    doping the substrate with a material selected from the group consisting of a p-type and n-type dopant.

4. The method of claim 1 further comprising:
    forming a growth promotion layer overlying the substrate from a material selected from the group consisting of Ti, Ni, Au, Ta, Co, Ir. and Pt; and,
    wherein growing nanowires includes growing nanowires from the growth promotion layer.

5. The method of claim 4 wherein forming the growth promotion layer includes forming the growth promotion layer to a thickness in the range of about 0.5 to 5 nanometers (nm).

6. The method of claim 4 further comprising:
    following the formation of the growth promotion layer, annealing in an atmosphere selected from the group consisting of $O_2$, $N_2$, Ar, a vacuum, and forming gas, at a temperature in the range of about 300 to 1000°C.

7. The method of claim 1 wherein growing nanowires includes growing nanowires from a material selected from the group consisting of $IrO_2$, $TiO_2$, InO, ZnO, $SnO_2$, $Sb_2O_3$, $In_2O_3$, carbon, Pd, Pt, Au, Mo, Si, Ge, SiGe, CdSe, AlN, ZnS, InP, InAs, a core and shell structure made from a combination of two of the above-mentioned materials, and a segmented axis structure where each segment is made from one of the above-mentioned materials.

8. The method of claim 1 wherein growing nanowires includes growing $IrO_2$ nanowires using a metalorganic chemical vapor deposition (MOCVD) process as follows:
    introducing a (Methylcyclopentadienyl)(1,5-cyclooctadiene)Iridium(I) precursor at a temperature in the range of about 60 to 100°C.;
    introducing high purity oxygen at a flow rate in the range of about 50 to 500 standard cubic centimeters (sccm);
    introducing Ar at a flow rate in the range of about 50 to 500 sccm, as a carrier gas for the Ir precursor;
    establishing a base pressure in the range of about $1 \times 10^{-8}$ to $1 \times 10^{-3}$ torr, and using an $O_2$ bypass line, creating a subsequent pressure in the range of about 1 to 500 torr before the introduction of the Ir precursor; and,
    maintaining a substrate temperature in the range of about 200 to 500° C.

9. The method of claim 1 wherein depositing the insulator layer overlying the nanowires includes depositing a material selected from the group consisting of spin-on glass (SOG), such as silicates, phosphosilicates, and siloxanes, and low-k spin-on dielectrics such as nanoglass, MSQ (CH3SiO1.5), methyl silsequioxane, HSQ hydrogen silsequioxane (methyl Isobutyl Ketone), and silk.

10. The method of claim 1 wherein depositing the insulator layer overlying the nanowires includes depositing HSQ as follows:
    depositing a plurality of HSQ layers, using a spin rate in the range of about 100 to 10,000 revolution per minute (RPM); and,
    after each HSQ layer deposition, baking at a temperature in the range of about 100 to 400° C.

11. The method of claim 1 further comprising:
    following the deposition of the insulator layer, annealing at a temperature in the range of about 400 to 1000° C.; and,
    in response to the annealing, transforming the insulator layer into a stiochiometric composition Si oxide layer.

12. The method of claim 1 further comprising:
    following the etching to expose the nanowires underlying the electrode edges, annealing at a temperature in the range of about 200 to 1000° C. for a duration in the range of about 10 to 3600 seconds.

13. The method of claim 3 wherein doping the substrate includes forming a doped portion of substrate underlying the electrode edges, and an undoped portion of the substrate between the overlying electrode edges; and,
    wherein etching to expose the nanowires underlying the electrode edges includes etching to expose the doped substrate portions.

14. The method of claim 5 wherein forming the growth promotion layer overlying the substrate includes selectively forming the growth promotion layer on portions of the substrate underlying the electrode edges.

15. An ambient environment nanowire sensor, the sensor comprising:
    a substrate;
    a first plurality of grown nanowires, exposed to an ambient environment;
    a patterned metal electrode with edge regions overlying the tips of the first plurality of nanowires, and a center region between the edge regions; and,
    an insulator layer interposed between the substrate and the electrode center region.

16. The sensor of claim 15 further comprising:
    a second plurality of grown nanowires;
    wherein the insulator layer overlies the second plurality of nanowires; and,
    wherein the electrode center region overlies the tips of the second plurality of nanowires.

17. The sensor of claim 15 wherein the substrate is a material selected from the group consisting of Silicon-on-insulator (SOI), Silicon (Si), polycrystalline Si, SiGermanium (SiGe), glass, plastic, quartz, and a transparent conductive electrode.

18. The sensor of claim 15 wherein the substrate is doped with a material selected from the group consisting of a p-type and n-type dopant.

19. The sensor of claim 15 further comprising:
    a growth promotion layer overlying the substrate made from a material selected from the group consisting of Ti, Ni, Au, Ta, Co, Ir, and Pt; and,
    wherein the first plurality of nanowires are formed overlying the growth promotion layer.

20. The sensor of claim 19 wherein the growth promotion layer has a thickness in the range of about 0.5 to 5 nanometers (nm).

21. The sensor of claim 15 wherein the first plurality of nanowires are a material selected from the group consisting of $IrO_2$, $TiO_2$, InO, ZnO, $SnO_2$, $Sb_2O_3$, $In_2O_3$, carbon, Pd, Pt, Au, Mo, Si, Ge, SiGe, CdSe, AlN, ZnS, InP, InAs, a core and shell structure made from a combination of two of the above-mentioned materials, and a segmented axis structure where each segment is made from one of the above-mentioned materials.

22. The sensor of claim 15 wherein the insulator layer is a material selected from the group consisting of spin-on glass (SOG), such as silicates, phosphosilicates, and siloxanes, low-k spin-on dielectrics such as nanoglass, MSQ (CH3SiO1.5), methyl silsequjoxane, HSQ hydrogen silsequjoxane (methyl Isobutyl Ketone), and silk, and a stiochiometric composition Silicon oxide.

23. The sensor of claim 16 wherein the substrate includes doped and undoped substrate portions; and,
wherein the first plurality of nanowires overlie doped substrate portions and the second plurality of nanowires overlie an undoped substrate portion.

24. The sensor of claim 19 wherein the growth promotion layer is selectively formed in portions that underlie the electrode edge regions.

* * * * *